(12) United States Patent
Hu et al.

(10) Patent No.: US 9,905,179 B2
(45) Date of Patent: Feb. 27, 2018

(54) SHIFT REGISTER, DRIVING METHOD, GATE DRIVING CIRCUIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Like Hu, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 166 days.

(21) Appl. No.: 14/786,046

(22) PCT Filed: Mar. 20, 2015

(86) PCT No.: PCT/CN2015/074651
§ 371 (c)(1),
(2) Date: Oct. 21, 2015

(87) PCT Pub. No.: WO2016/061994
PCT Pub. Date: Apr. 28, 2016

(65) Prior Publication Data
US 2016/0247477 A1 Aug. 25, 2016

(30) Foreign Application Priority Data
Oct. 20, 2014 (CN) .......................... 2014 1 0559992

(51) Int. Cl.
*G11C 19/00* (2006.01)
*G09G 3/36* (2006.01)
(Continued)

(52) U.S. Cl.
CPC ............ *G09G 3/3677* (2013.01); *G09G 3/36* (2013.01); *G11C 19/28* (2013.01); *H03K 19/20* (2013.01);
(Continued)

(58) Field of Classification Search
None
See application file for complete search history.

(56) References Cited

U.S. PATENT DOCUMENTS 4,855,623 A * 8/1989 Flaherty ................. H03K 5/023
326/32
5,883,529 A * 3/1999 Kumata .................... G06F 1/06
326/83
(Continued)

FOREIGN PATENT DOCUMENTS

CN 1609939 A 4/2005
CN 1648972 A 8/2005
(Continued)

OTHER PUBLICATIONS

International Search Report and Written Opinion both dated Jul. 2, 2015; PCT/CN2015/074651.
(Continued)

*Primary Examiner* — Tuan T Lam
(74) *Attorney, Agent, or Firm* — Ladas & Parry LLP

(57) ABSTRACT

A shift register, a driving method, a gate driving circuit and a display device. The shift register comprises an input terminal (STV_IN), a reset terminal (STV_RES), a trigger terminal (CLK_IN), an output terminal (STV_OUT), an input module connected to the input terminal (STV_IN) and the reset terminal (STV_RES) and configured to deliver a signal received from the input terminal (STV_IN) or a signal received from the reset terminal (STV_RES) to an output module under the control of an external signal (U2D, D2U);
(Continued)

a trigger module connected to the input terminal (STV_IN), the reset terminal (STV_RES) and the trigger terminal (CLK_IN) and configured to deliver a signal received from the trigger terminal (CLK_IN) to the output module when a signal is received from the input terminal (STV_IN) or from the reset terminal (STV_RES); and the output module connected to the input module, the trigger module and the output terminal (STV_OUT) and configured to flip a signal outputted from the output terminal (STV_OUT) between an output state and a reset state according to a signal from the input module under the trigger of the signal from the trigger module. The trigger signal is filtered out when no signal is inputted by setting the trigger module or the trigger unit, such that remaining circuits keep in a steady state holding state, which is benefit for reducing of power consumption.

20 Claims, 3 Drawing Sheets

(51) Int. Cl.
  *G11C 19/28* (2006.01)
  *H03K 19/20* (2006.01)
(52) U.S. Cl.
  CPC ............... *G09G 2310/0286* (2013.01); *G09G 2330/021* (2013.01)

(56) References Cited

U.S. PATENT DOCUMENTS

| | | | | |
|---|---|---|---|---|
| 6,879,313 | B1* | 4/2005 | Kubota | G09G 3/3688 345/100 |
| 2001/0011987 | A1* | 8/2001 | Kubota | G09G 3/3677 345/98 |
| 2003/0174115 | A1* | 9/2003 | Washio | G09G 3/3688 345/98 |
| 2004/0017878 | A1* | 1/2004 | Sun | G11C 19/28 377/64 |
| 2004/0150610 | A1 | 8/2004 | Zebedee et al. | |
| 2004/0190672 | A1 | 9/2004 | Lu et al. | |
| 2004/0239608 | A1 | 12/2004 | Chung | |
| 2005/0184784 | A1 | 8/2005 | Washio et al. | |
| 2005/0259778 | A1* | 11/2005 | Kimura | G09G 3/20 377/78 |
| 2006/0017685 | A1* | 1/2006 | Tseng | G11C 19/28 345/100 |
| 2007/0248204 | A1 | 10/2007 | Tobita | |
| 2009/0267924 | A1* | 10/2009 | Shimizu | G09G 3/3677 345/204 |
| 2010/0103315 | A1 | 4/2010 | Li et al. | |
| 2010/0214354 | A1 | 8/2010 | Moon | |
| 2014/0055334 | A1 | 2/2014 | Qing et al. | |
| 2015/0228354 | A1 | 8/2015 | Qing et al. | |
| 2015/0248867 | A1 | 9/2015 | Tan et al. | |
| 2015/0371716 | A1 | 12/2015 | Shao et al. | |
| 2016/0189797 | A1* | 6/2016 | Yamamoto | G11C 19/28 377/64 |

FOREIGN PATENT DOCUMENTS

| | | | |
|---|---|---|---|
| CN | 101064194 | A | 10/2007 |
| CN | 102708816 | A | 10/2012 |
| CN | 103236272 | A | 8/2013 |
| CN | 103345911 | A | 10/2013 |
| CN | 104078017 | A | 10/2014 |
| CN | 104269145 | * | 1/2015 |
| CN | 104282282 | A | 1/2015 |
| CN | 104361853 | * | 2/2015 |

OTHER PUBLICATIONS

First Chinese Office Action Appln. No. 201410559992.1; dated Mar. 21, 2016.
Second Chinese Office Action dated Oct. 10, 2016; Appln. No. 201410559992.1.
The Fourth Chinese Office Action dated Aug. 21, 2017; Appln. 201410559992.1.
Third Chinese Office Action dated Apr. 6, 2017; Appln. No. 201410559992.1.

* cited by examiner

US 9,905,179 B2

SHIFT REGISTER, DRIVING METHOD, GATE DRIVING CIRCUIT AND DISPLAY DEVICE

TECHNICAL FIELD OF THE DISCLOSURE

The present disclosure relates to a shift register, a driving method, a gate driving circuit and a display device.

BACKGROUND

A shift register is commonly used as an elementary unit for an integrated driving circuit. The shift register mainly functions to enable a signal inputted externally to be shifted stage by stage among a plurality of stages of shift registers by using a clock signal as a trigger signal, and thus is commonly used in a gate driving circuit and a data driving circuit of a Thin Film Transistor-Liquid Crystal Display (TFT-LCD) based on such characteristics.

For a display panel, higher a solution is, higher a frequency of its clock signal is, which makes electronic elements or circuit modules controlled by the clock signal in the shift register continuously flip their states with a high frequency, for example, a switching element flips its state between ON and OFF, or a latch flips its latch signal between 0 and 1. However, a single shift register generally just enables the above state flipping during a short period of time (cycle(s) of the clock signal), but disables the above state flipping in most of the time. Such a problem will not only cause problems such as increasing of high frequency noise, shortening of life span of the elements, and etc., but also increases power consumption unnecessarily, and thus performance of a whole display device is affected.

SUMMARY

Aiming at defects in the prior art, the present disclosure discloses a shift register, a driving method, a gate driving circuit and a display device. According to the present disclosure, a trigger module or a trigger unit is set, such that a trigger signal is filtered out and remaining parts of the circuit keeps in a steady-state holding state when no signal is inputted, which is benefit for reducing of power consumption of the circuit.

According to one aspect of the present disclosure, there is provided a shift register comprising an input terminal, a reset terminal, a trigger terminal and an output terminal, and further comprising: an input module connected to the input terminal and the reset terminal and configured to deliver a signal received from the input terminal or a signal received from the reset terminal to an output module under the control of an external signal; a trigger module connected to the input terminal, the reset terminal and the trigger terminal and configured to deliver a signal received from the trigger terminal to the output module when a signal is received from the input terminal or from the reset terminal; and the output module connected to the input module, the trigger module and the output terminal and configured to flip a signal outputted from the output terminal between an output state and a reset state according to a signal from the input module under the trigger of the signal from the trigger module.

Preferably, the trigger module comprises a first NOR gate and a second NOR gate, a first input terminal of the first NOR gate is connected to the input terminal of the shift register, a second input terminal of the first NOR gate is connected to the reset terminal of the shift register, an output terminal of the first NOR gate is connected to a first input terminal of the second NOR gate, a second input terminal of the second NOR gate is connected to the trigger terminal of the shift register, and an output terminal of the second NOR gate is connected to the output module.

Preferably, the output module comprises a first tri-state NOT gate, a second tri-state NOT gate, a first inverter and a second inverter; the output terminal of the second NOR gate is connected to an input terminal of the first inverter, a non-inverting control terminal of the first tri-state NOT gate and an inverting control terminal of the second tri-state NOT gate; an output terminal of the first inverter is connected to an inverting control terminal of the first tri-state NOT gate and a non-inverting control terminal of the second tri-state NOT gate; an output terminal of the first tri-state NOT gate and an output terminal of the second tri-state NOT gate are connected to an input terminal of the second inverter; an output terminal of the second inverter is connected to an input terminal of the second tri-state NOT gate and the output terminal of the shift register; and an input terminal of the first tri-state NOT gate is connected to an output terminal of the input module.

Preferably, the trigger module comprises an OR gate and a NAND gate, a first input terminal of the OR gate is connected to the input terminal of the shift register, a second input terminal of the OR gate is connected to the reset terminal of the shift register, an output terminal of the OR gate is connected to a first input terminal of the NAND gate, a second input terminal of the NAND gate is connected to the trigger terminal of the shift register, and an output terminal of the NAND gate is connected to the output module.

Preferably, the output module comprises a first tri-state NOT gate, a second tri-state NOT gate, a first inverter and a second inverter; the output terminal of the NAND gate is connected to an input terminal of the first inverter, an inverting control terminal of the first tri-state NOT gate and a non-inverting control terminal of the second tri-state NOT gate; an output terminal of the first inverter is connected to a non-inverting control terminal of the first tri-state NOT gate and an inverting control terminal of the second tri-state NOT gate; an output terminal of the first tri-state NOT gate and an output terminal of the second tri-state NOT gate are connected to an input terminal of the second inverter; an output terminal of the second inverter is connected to an input terminal of the second tri-state NOT gate and the output terminal of the shift register; and an input terminal of the first tri-state NOT gate is connected to an output terminal of the input module.

Preferably, the input module comprises a first switching element, a second switching element, a third switching element and a fourth switching element; the input terminal of the shift register is connected to a first terminal of the third switching element and a second terminal of the first switching element; the reset terminal of the shift register is connected to a second terminal of the fourth switching element and a first terminal of the second switching element; the input terminal of the first tri-state NOT gate in the output module is connected to a second terminal of the third switching element, a first terminal of the first switching element, a first terminal of the fourth switching element and a second terminal of the second switching element; a control terminal of the first switching element and a control terminal of the fourth switching element are connected to a first external signal, and a control terminal of the second switching element and a control terminal of the third switching element are connected to a second external signal.

Preferably, the first switching element and the second switching element are N channel thin film transistors, and the third switching element and the fourth switching element are P channel thin film transistors.

According to another aspect of the present disclosure, there is further provided a driving method for a shift register which adopts any one of the above shift registers. The driving method comprises: the trigger module delivering a signal received from the trigger terminal to the output module when a signal is received at the input terminal, such that the output module flips the signal outputted from the output terminal to the output state according to the signal from the input module under the trigger of the signal delivered by the trigger module; and the trigger module delivering a signal received from the trigger terminal to the output module when a signal is received at the reset terminal, such that the output module flips the signal outputted from the output terminal to the reset state according to the signal from the input module under the trigger of the signal delivered by the trigger module.

According to yet another aspect of the present disclosure, there is further provided a gate driving circuit comprising at least one stage of shift register unit which adopts any one of the above shift registers.

Except a first stage of shift register unit and a last stage of shift register unit, for each stage of shift register unit, the input terminal thereof is connected to the output terminal of its previous stage of shift register unit, and the reset terminal thereof is connected to the output terminal of its next stage of shift register unit.

The first external signal is at a high level and the second external signal is at a low level, the gate driving circuit implements a forward scanning; or the first external signal is at a low level and the second external signal is at a high level, the gate driving circuit implements a backward scanning.

According to further another aspect of the present disclosure, there is further provided a display device comprising any one of the above gate driving circuits.

It can be known from the above technical solutions, in the present disclosure, by aid of the trigger module or the trigger unit, an external trigger signal and the circuit inside the shift register are insulated from each other when no signal is inputted and are connected when a signal is inputted, such that the elements or the circuit modules inside the shift register flip their states only when a signal is inputted, and thus power consumed by state flipping when no signal is inputted can be saved, which is benefit for reducing of power consumption of the whole circuit and improving of performance of the display device.

BRIEF DESCRIPTION OF THE DRAWINGS

In order to explain solutions in the embodiments of the present disclosure or the prior art more clearly, accompanying drawings required for describing the embodiments of the present disclosure or the prior art will be introduced briefly below. Obviously, the accompanying drawings described below only some embodiments of the present disclosure, but those ordinary skilled in the art may obtain other drawings according to these accompanying drawings without any inventive labors.

DETAILED DESCRIPTION

In order to make the purpose, the technical solutions and the advantages of the embodiments of the present disclosure clearer, below the technical solutions in the embodiments of the present disclosure will be described clearly and thoroughly in conjunction with the accompanying drawings of the embodiments of the present disclosure. Obviously, the described embodiments are only some but not all of the embodiments of the present disclosure. Other embodiments obtained by those skilled in the art based on the described embodiments without paying inventive labor shall belong to the scope sought for protection in the present disclosure.

It should be explained in the present disclosure that terms of "connect" and "connect" should be understood broadly, for example, direct connection or indirect connection via an intermediary, unless specified and defined otherwise. For those skilled in the art, specific meaning of such terms in the present disclosure can be understood according to particular circumstances or applications.

Figure 1:
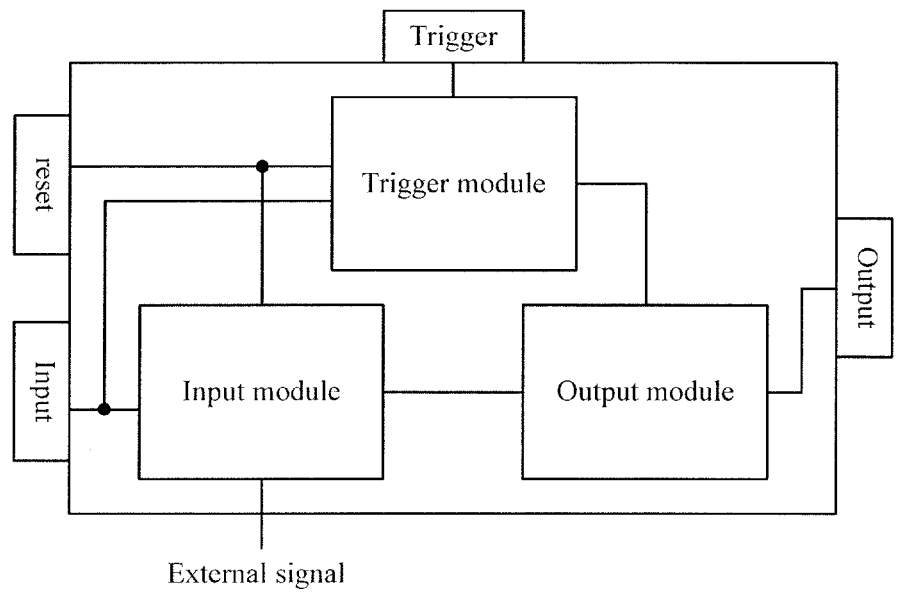
FIG. 1 is a block diagram of a structure of a shift register provided in embodiments of the present disclosure.

FIG. 1 illustrates a structure of a shift register provided in an embodiment of the present disclosure. The shift register comprises an input terminal, a reset terminal, a trigger terminal and an output terminal. The input terminal is used for receiving an input signal, and the input signal may generally be a pulse signal adopting a high level as its valid level or a signal having other shapes. The reset terminal is used for receiving a reset signal, and the reset signal may generally be a pulse signal adopting a high level as its valid level. The trigger terminal is used for receiving a trigger signal, and the trigger signal may generally be a clock trigger signal having a high level and a low level alternated. A trigger refers to a process in which certain variation of the circuit structure will be excited when the trigger signal changes from a high level to a low level and/or from a low level to a high level. The output terminal is used for outputting an output signal according to the input signal or the reset signal, the output signal may generally be described as the output signal being an output state or as the output signal being at a reset state, the output state and the reset state are one and the other of a high level and a low level respectively, and represents whether the signal registered in the shift register comes from the received input signal or from the received reset signal. Based on the above respective terminals, a main function of the shift register is switching between the output state and the reset state according to the input signal and the reset signal under the trigger of the trigger signal, that is, shifting the input signal according to the trigger of the trigger signal and making the output signal being in the output state, and then switching the output signal to the reset state when receiving the reset signal.

With reference to FIG. 1, the shift register further comprises an input module, a trigger module and an output module.

The input module is connected to the input terminal and the reset terminal, and is configured to deliver a signal received from the input terminal or a signal received from the reset terminal to the output module under the control of an external signal.

The trigger module is connected to the input terminal, the reset terminal and the trigger terminal, and is configured to deliver a signal received from the trigger terminal to the output module when a signal is received from the input terminal or from the reset terminal.

The output module is connected to the input module, the trigger module and the output terminal, and is configured to flip a signal outputted from the output terminal between an output state and a reset state according to the signal from the input module under the trigger of the signal from the trigger module.

It can be seen that the input module controls the entrance of the input signal and the reset signal under the control of the external signal, the output module controls switching between the output state and the reset state of the output signal under the trigger of the signal from the trigger module, the trigger module enables the entrance of the signal from the trigger terminal only when a signal is received from the input terminal or the reset terminal, that is, the trigger terminal and the output module are insulated during other time periods, such that the periodic trigger signal which is generally connected to the trigger terminal will not have a great effect on the electronic elements or circuit modules in the output module, thus power consumption required for state flipping is reduced.

Herein, the input module can be comprised of at least two switching elements, the entrance of the input signal and the reset signal is controlled by aid of the control on ON or OFF of the switching elements, particular implementations of which can be obtained by referring to the prior art. The output module can be comprised of at least one capacitor and at least two switching elements, potential at a connection point of the input module and the output module is pulled up or down by aid of the control on charging or discharging of the capacitor, such that the output signal flips between a high level and a low level, particular implementations of which can also be obtained by referring to the prior art. As for the trigger module, AND gate, OR gate, NOT gate, NAND gate, NOR gate, AND-OR gate, tri-state gate and so on in digital logic operation circuits can be selected to filter out a part of the trigger signal when no input signal and no reset signal is received and keep a part of the trigger signal when the input signal or the reset signal is received according to the logic values of the input signal, the reset signal and the trigger signal.

Figure 2:
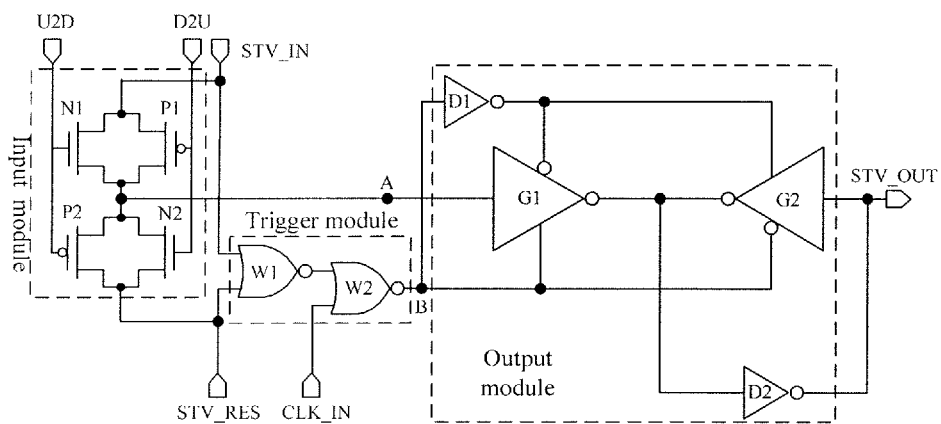
FIG. 2 is a circuit diagram of a shift register provided in the embodiments of the present disclosure.

For example, with reference to the circuit structure of the shift register as shown in FIG. 2, the shift register comprises an input terminal STV_IN, a reset terminal STV_RES, a trigger terminal CLK_IN and an output terminal STV_OUT.

The trigger module particularly comprises a first NOR gate W1 and a second NOR gate W2. A first input terminal of the first NOR gate W1 is connected to the input terminal STV_IN of the shift register, a second input terminal of the first NOR gate W1 is connected to the reset terminal STV_RES of the shift register, an output terminal of the first NOR gate W1 is connected to a first input terminal of the second NOR gate W2. A second input terminal of the second NOR gate W2 is connected to the trigger terminal CLK_IN of the shift register, and an output terminal of the second NOR gate W2 is connected to the output module.

The output terminal particularly comprises a first tri-state NOT gate G1, a second tri-state NOT gate G2, a first inverter D1 and a second inverter D2. The output terminal of the second NOR gate W2 is connected to an input terminal of the first inverter D1, a non-inverting control terminal of the first tri-state NOT gate G1 and an inverting control terminal of the second tri-state NOT gate G2. An output terminal of the first inverter D1 is connected to an inverting control terminal of the first tri-state NOT gate G1 and a non-inverting control terminal of the second tri-state NOT gate G2. An output terminal of the first tri-state NOT gate G1 and an output terminal of the second tri-state NOT gate G2 are connected to an input terminal of the second inverter D2. An output terminal of the second inverter D2 is connected to an input terminal of the second tri-state NOT gate G2 and the output terminal STV_OUT of the shift register. An input terminal of the first tri-state NOT gate G1 is connected to a point A at the output terminal of the input module.

The input module particularly comprises a first switching element N1, a second switching element N2, a third switching element P1 and a fourth switching element P2. Each of the first switching element N1 and the second switching element N2 is turned on when the control terminal thereof is at a high level, and each of the third switching element P1 and the fourth switching element P2 is turned on when the control terminal thereof is at a low level.

The input terminal STV_IN of the shift register is connected to a first terminal of the third switching element P1 and a second terminal of the first switching element N1. The reset terminal STV_RES of the shift register is connected to a second terminal of the fourth switching element P2 and a first terminal of the second switching element N2.

The input terminal of the first tri-state NOT gate G1 in the output module is connected to a second terminal of the third switching element P1, a first terminal of the first switching element N1, a first terminal of the fourth switching element P2 and a second terminal of the second switching element N2.

A control terminal of the first switching element N1 and a control terminal of the fourth switching element P2 are connected to a first external signal U2D, and a control terminal of the second switching element N2 and a control terminal of the third switching element P1 are connected to a second external signal D2U.

Herein, the first NOR gate W1 or the second NOR gate W2 is a kind of elementary element in digital logic circuits, the output terminal of which is at a high level (logic 1) only when the first input terminal and the second input terminal thereof are both at a low level (logic 0). The first tri-state NOT gate G1 or the second tri-state NOT gate G2 is a kind of control switch, which represents an output of a normal NOT gate (that is, the output terminal shows 1 when the input terminal shows 0, or the output terminal shows 0 when the input terminal shows 1) when the non-inverting control terminal thereof is at a high level (logic 1) and the inverting control terminal thereof is at a low level (logic 0); and represents a resistor with an extremely high resistance value which is considered as a state wherein no current flows through the digital circuit (that is, open circuit) when the non-inverting control terminal thereof is at a low level (logic 0) and the inverting control terminal thereof is at a high level (logic 1). The first inverter D1 or the second inverter D2 is another elementary element in the digital logic circuits, the output terminal of which shows 0 when the input terminal thereof shows 1 and shows 1 when the input terminal thereof shows 0. The first switching element N1 or the second switching element N2 is a kind of switching element, the first terminal and the second terminal of which are connected when the control terminal is at a high level (logic 1). The third switching element P1 or the fourth switching element P2 is another kind of switching element, the first terminal and the second terminal of which are connected when the control terminal is at a low level (logic 0).

According to the above described structure of the trigger module, the actual logic operation thereof can be represented by the following equation:

$$\begin{aligned} B &= \overline{\overline{[STV\_IN + STV\_RES]} + CLK\_IN} \\ &= STV\_IN * \overline{CLK\_IN} + STV\_RES * \overline{CLK\_IN} \\ &= [STV\_IN + STV\_RES] * \overline{CLK\_IN} \\ &= [STV\_IN + STV\_RES] * \overline{CLK\_IN} \\ &= \overline{\overline{STV\_IN + STV\_RES} * CLK\_IN} \end{aligned}$$

where B is a logic level value of a signal at a point B in FIG. 2, STV_IN is a logic level value of a signal at the input terminal, STV_RES is a logic level value of a signal at the reset terminal, and CLK_IN is a logic level value of a signal at the trigger terminal. The above equation represents that $B=\overline{CLK\_IN}$ only when STV_IN=1 and/or STV_RES=1, otherwise B=0.

It can be seen that one of the signal inputted from the input terminal STV_IN and the signal inputted from the reset terminal STV_RES is selected through the first external signal U2D and the second external signal D2U to be entered to the point A in FIG. 2, and is then shifted and outputted as the signal STV_OUT at the output terminal under the control of the trigger terminal CLK_IN.

Figure 3:
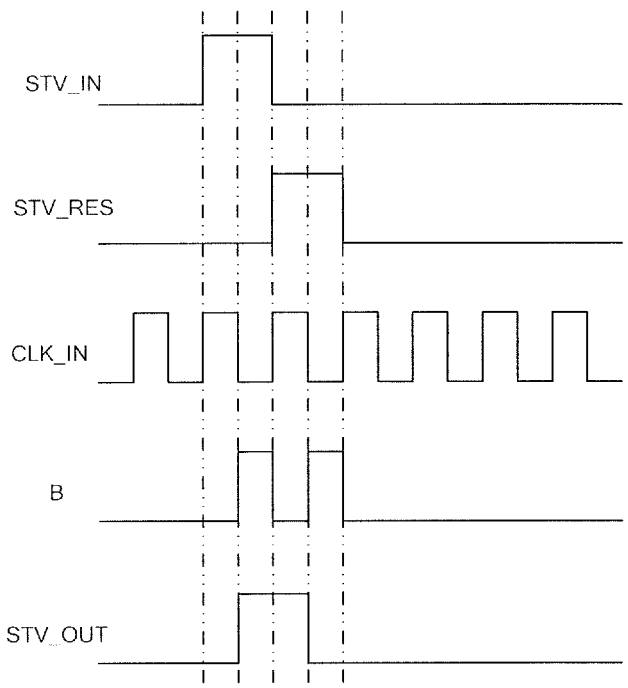
FIG. 3 is a timing sequence diagram of a circuit of a shift register provided in the embodiments of the present disclosure.

FIG. 3 illustrates a timing sequence diagram of the circuit of the shift register as shown in FIG. 2. The timing sequence diagram is for a forward scanning, that is, the first external signal U2D is at a high level and the second external signal D2U is at a low level, and the input module transmits the signal received at the input terminal to the output module at this time. It should be understood that the first external signal U2D is at a low level and the second external signal D2U is at a high level during a backward scanning, and the input module transmits the signal received at the reset terminal to the output module at this time.

It should be understood that the input terminal of the shift register can be connected to the output terminal of its previous stage of shift register, and the reset terminal of the shift register can be connected to the output terminal its next stage of shift register.

As shown in FIG. 3, when the signal inputted from the input terminal STV_IN and the signal inputted from the reset terminal STV_RES are both at a low level, the point B of the trigger module in FIG. 2 is at a low level independent of a logic level value of a signal at the trigger terminal CLK_IN. At this time, the non-inverting control terminal of the first tri-state NOT gate G1 is at a low level, the inverting control terminal of the first tri-state NOT gate G1 is at a high level, and thus the first tri-state NOT gate G1 is turned off. The non-inverting control terminal of the second tri-state NOT gate G2 is at a high level, the inverting control terminal of the second tri-state NOT gate G2 is at a low level, and thus the second tri-state NOT gate G2 is turned on, such that the second tri-state NOT gate G2 and the second inverter D2 form a steady-state holding circuit.

When the signal inputted from the input terminal STV_IN is at a high level, the signal inputted from the reset terminal STV_RES is at a low level, and the signal at the trigger terminal CLK_IN is at a high level, the point A at the output terminal of the input module in FIG. 2 is at a high level, the point B at the output terminal of the trigger module in FIG. 2 is at a low level. Therefore, the first tri-state NOT gate G1 is turned off, such that the signal at the point A cannot enter a latch formed by the output module; and the second tri-state NOT gate G2 is turned on, such that the second tri-state NOT gate G2 and the second inverter D2 form a steady-state holding circuit.

When the signal inputted from the input terminal STV_IN is at a high level, the signal inputted from the reset terminal STV_RES is at a low level, and the signal at the trigger terminal CLK_IN is at a low level, the point A at the output terminal of the input module in FIG. 2 is at a high level, the point B at the output terminal of the trigger module in FIG. 2 is at a high level. At this time, the non-inverting control terminal of the first tri-state NOT gate G1 is at a high level, the inverting control terminal of the first tri-state NOT gate G1 is at a low level, and thus the first tri-state NOT gate G1 is turned on, such that the signal at the point A is inverted by the first tri-state NOT gate G1 and is then outputted to the output terminal STV_OUT through the second inverter D2. That is, the level outputted at the output terminal STV_OUT is the level inputted at the point A. The non-inverting control terminal of the second tri-state NOT gate G2 is at a low level, the inverting control terminal of the second tri-state NOT gate G2 is at a high level, and thus the second tri-state NOT gate G2 is turned off.

When the signal inputted from the input terminal STV_IN is at a low level, the signal inputted from the reset terminal STV_RES is at a high level, and the signal at the trigger terminal CLK_IN is at a high level, the point B at the output terminal of the trigger module in FIG. 2 is at a low level. Therefore, the first tri-state NOT gate G1 is turned off and the second tri-state NOT gate G2 is turned on, such that the second tri-state NOT gate G2 and the second inverter D2 form a steady-state holding circuit.

When the signal inputted from the input terminal STV_IN is at a low level, the signal inputted from the reset terminal STV_RES is at a high level, and the signal at the trigger terminal CLK_IN is at a low level, the point A at the output terminal of the input module in FIG. 2 is at a low level, the point B at the output terminal of the trigger module in FIG. 2 is at a high level. Therefore, the first tri-state NOT gate G1 is turned on and the second tri-state NOT gate G2 is turned off, such that the signal at the point A is inverted by the first tri-state NOT gate G1 and is then outputted to the output terminal STV_OUT through the second inverter D2. That is, the level outputted at the output terminal STV_OUT is the level inputted at the point A.

In case that the trigger terminal is directly connected to the output module without the above logic operation of the trigger module, a connection path between the first tri-state NOT gate G1 and the second inverter D2 still exists even no signal is input at the point A, since the trigger terminal CLK_IN is commonly connected to a clock trigger signal with levels being flipped continuously which has a duty ratio about 1/2, the power consumed by the first tri-state NOT gate G1 and the second inverter D2 are very high.

In the embodiments of the present disclosure, by aid of the above described trigger module, an external trigger signal and the circuits inside the shift register are insulated from each other (that is, potential at the point B is kept at a low level constantly, such that no trigger is made) when no signal is inputted (no signal is inputted from the input terminal, and no signal is inputted from the reset terminal), and are connected (that is, the potential at the point B is at a level being logic NOT of a level at the trigger terminal CLK_IN) when a signal is inputted (a signal is inputted from the input terminal, or a signal is inputted from the reset terminal), such that the elements or the circuit modules inside the shift register flip their states only when a signal is inputted, and thus power consumed by state flipping when no signal is inputted can be saved, which is benefit for reducing of power consumption of the whole circuit and improving of performance of the display device.

Furthermore, one of a signal inputted from the input terminal STV_IN and a signal inputted from the reset terminal STV_RES can be selected by the input module as shown in FIG. 2 according to the first external signal U2D and the second external signal D2U. Herein, the input terminal STV_IN and the reset terminal STV_RES are symmetric with each other in terms of structure, which means that the input terminal STV_IN and the reset terminal STV_RES can be exchanged in this structure, such that bi-directional shifting functions comprising a forward shifting and a backward shifting can be achieved by the shift register under the control of the first external signal U2D and the second external signal D2U. In addition, it can be seen that the reset terminal and the input terminal can be exchanged with each other with no alternation of the essential technical solution of the embodiments of the present disclosure. Preferably, the first switching element N1 and the second switching element N2 are N channel thin film transistors, the third switching element P1 and the fourth switching element P2 are P channel thin film transistors. The first terminal of each of the switching elements is a source of TFT, the second terminal thereof is a drain of TFT, and the control terminal thereof is a gate of TFT. Such configuration can be formed concurrently under the manufacturing process of TFTs, and is applied to the shift register units in the gate driving circuit in the field of display technology.

In the output terminal as shown in FIG. 2, functions of the output terminal can be achieved directly by a latch constituted by two tri-state NOT gates and two inverters. Meanwhile, such a configuration is suitable for the Complementary Metal Oxide Semiconductor CMOS manufacturing process, and is applied to the shift register units in the gate driving circuit in the field of display technology.

Furthermore, in the trigger module as shown in FIG. 2, functions of the trigger module are achieved by only two gate circuits, and such configuration is easy to be implemented. However, the configuration of the trigger module in the embodiments of the present disclosure is not limited thereto. The circuit structure of another shift register is shown in FIG. 4, and the timing sequence diagram for the circuit of the shift register is shown in FIG. 5.

Figure 4:
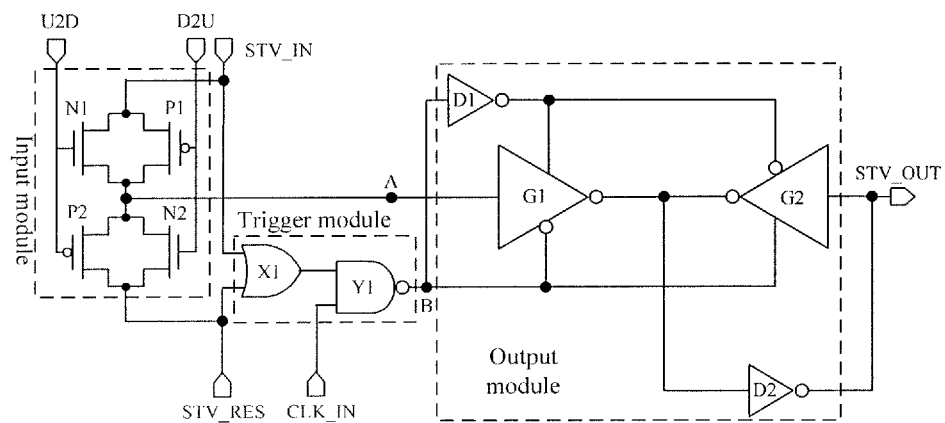
FIG. 4 is a circuit diagram of a shift register provided in the embodiments of the present disclosure.
Figure 5:
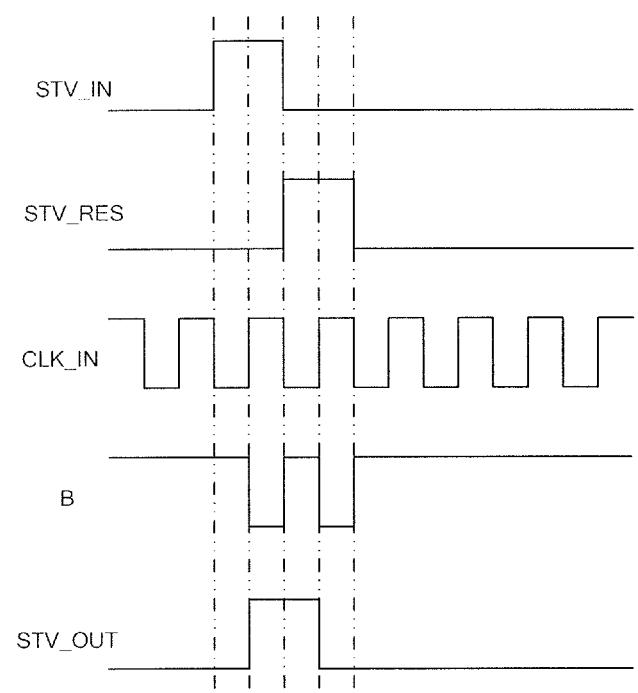
FIG. 5 is a timing sequence diagram of a circuit of a shift register provided in the embodiments of the present disclosure.

The trigger module of the shift register as shown in FIG. 4 particularly comprises an OR gate X1 and a NAND gate Y1. A first input terminal of the OR gate X1 is connected to the input terminal STV_IN of the shift register, a second input terminal of the OR gate X1 is connected to the reset terminal STV_RES of the shift register, an output terminal of the OR gate X1 is connected to a first input terminal of the NAND Y1, a second input terminal of the NAND gate Y1 is connected to the trigger terminal CLK_IN of the shift register, and an output terminal of the NAND gate Y1 is connected to the output module.

The output module of the shift register as shown in FIG. 4 particularly comprises a first tri-state NOT gate G1, a second tri-state NOT gate G2, a first inverter D1 and a second inverter D2. The output terminal of the NAND gate Y1 is connected to an input terminal of the first inverter D1, an inverting control terminal of the first tri-state NOT gate G1 and a non-inverting control terminal of the second tri-state NOT gate G2. An output terminal of the first inverter D1 is connected to a non-inverting control terminal of the first tri-state NOT gate G1 and an inverting control terminal of the second tri-state NOT gate G2. An output terminal of the first tri-state NOT gate G1 and an output terminal of the second tri-state NOT gate G2 are connected to an input terminal of the second inverter D2. An output terminal of the second inverter D2 is connected to an input terminal of the second tri-state NOT gate G2 and the output terminal STV_OUT of the shift register. An input terminal of the first tri-state NOT gate is connected to the point A at the output terminal of the input module.

Herein, the tri-state NOT gates and the inverters are same as described above, the OR gate X1 and the NAND gate Y1 are elementary elements in the digital logical circuits, the output terminal of the OR gate X1 outputs a result obtained after performing a logic OR on the signal inputted at the first input terminal thereof and the signal inputted at the second input terminal thereof, and the output terminal of the NAND gate outputs a result obtained after performing a logic AND on the signal inputted at the first input terminal thereof and the signal inputted at the second input terminal thereof and then further performing a logic NOT on that basis.

According to the above described structure of the trigger module, the actual logic operation thereof can be represented by the following equation:

$$B = \overline{[STV\_IN + STV\_RES] * CLK\_IN}$$
$$= \overline{STV\_IN * CLK\_IN} + \overline{STV\_RES * CLK\_IN}$$

where B is a logic level value of a signal at a point B in FIG. 4, STV_IN is a logic level value of a signal at the input terminal, STV_RES is a logic level value of a signal at the reset terminal, and CLK_IN is a logic level value of a signal at the trigger terminal. The above equation represents that B=$\overline{CLK\_IN}$ only when STV_IN=1 and/or STV_RES=1, otherwise B=1.

FIG. 5 illustrates a timing sequence diagram of the circuit of the shift register as shown in FIG. 4. The timing sequence diagram is for a forward scanning, that is, the first external signal U2D is at a high level and the second external signal D2U is at a low level, and the input module transmits the signal received at the input terminal to the output module at this time. It should be understood that the first external signal U2D is at a low level and the second external signal D2U is at a high level during a backward scanning, and the input module transmits the signal received at the reset terminal to the output module at this time.

As shown in FIG. 5, when the signal inputted from the input terminal STV_IN and the signal inputted from the reset terminal STV_RES are both at a low level, the point B of the trigger module in FIG. 4 is at a high level independent of a logic level value of a signal at the trigger terminal CLK_IN. At this time, the non-inverting control terminal of the first tri-state NOT gate G1 is at a low level, the inverting control terminal of the first tri-state NOT gate G1 is at a high level, and thus the first tri-state NOT gate G1 is turned off. The non-inverting control terminal of the second tri-state NOT gate G2 is at a high level, the inverting control terminal of the second tri-state NOT gate G2 is at a low level, and thus the second tri-state NOT gate G2 is turned on, such that the second tri-state NOT gate G2 and the second inverter D2 form a steady-state holding circuit.

When the signal inputted from the input terminal STV_IN is at a high level, the signal inputted from the reset terminal STV_RES is at a low level, and the signal at the trigger terminal CLK_IN is at a low level, the point A at the output terminal of the input module in FIG. 4 is at a high level, the point B at the output terminal of the trigger module in FIG. 4 is at a high level. Therefore, the first tri-state NOT gate G1 is turned off, such that the signal at the point A cannot enter a latch formed by the output module; and the second tri-state NOT gate G2 is turned on, such that the second tri-state NOT gate G2 and the second inverter D2 form a steady-state holding circuit.

When the signal inputted from the input terminal STV_IN is at a high level, the signal inputted from the reset terminal STV_RES is at a low level, and the signal at the trigger terminal CLK_IN is at a high level, the point A at the output terminal of the input module in FIG. 4 is at a high level, the point B at the output terminal of the trigger module in FIG. 4 is at a low level. At this time, the non-inverting control terminal of the first tri-state NOT gate G1 is at a high level, the inverting control terminal of the first tri-state NOT gate G1 is at a low level, and thus the first tri-state NOT gate G1 is turned on, such that the signal at the point A is inverted by the first tri-state NOT gate G1 and is then outputted to the output terminal STV_OUT through the second inverter D2. That is, the level outputted at the output terminal STV_OUT is the level inputted at the point A. The non-inverting control terminal of the second tri-state NOT gate G2 is at a low level, the inverting control terminal of the second tri-state NOT gate G2 is at a high level, and thus the second tri-state NOT gate G2 is turned off.

When the signal inputted from the input terminal STV_IN is at a low level, the signal inputted from the reset terminal STV_RES is at a high level, and the signal at the trigger terminal CLK_IN is at a low level, the point B at the output terminal of the trigger module in FIG. 4 is at a high level. Therefore, the first tri-state NOT gate G1 is turned off and the second tri-state NOT gate G2 is turned on, such that the second tri-state NOT gate G2 and the second inverter D2 form a steady-state holding circuit.

When the signal inputted from the input terminal STV_IN is at a low level, the signal inputted from the reset terminal STV_RES is at a high level, and the signal at the trigger terminal CLK_IN is at a high level, the point A at the output terminal of the input module in FIG. 4 is at a low level, the point B at the output terminal of the trigger module in FIG. 4 is at a low level. At this time, the first tri-state NOT gate G1 is turned on and the second tri-state NOT gate G2 is turned off, such that the signal at the point A is inverted by the first tri-state NOT gate G1 and is then outputted to the output terminal STV_OUT through the second inverter D2. That is, the level outputted at the output terminal SD/OUT is the level inputted at the point A.

It can be seen that the trigger module with such a structure can also implement the function of the above described trigger module, and thus has a same contribution and achieves a similar technical effect.

According to another aspect, in the embodiments of the present disclosure, there is further provided a driving method for a shift register which adopts any one of the above shift registers. The driving method comprises two operation phases.

During a first operation phase, the trigger module delivers a signal received from the trigger terminal to the output module when a signal is received at the input terminal, such that the output module flips the signal outputted from the output terminal to the output state according to the signal from the input module under the trigger of the signal delivered by the trigger module.

During a second operation phase, the trigger module delivers a signal received from the trigger terminal to the output module when a signal is received at the reset terminal, such that the output module flips the signal outputted from the output terminal to the reset state according to the signal from the input module under the trigger of the signal delivered by the trigger module.

It can be seen that the driving method has technical features corresponding to those of any one of the above shift registers, and thus can solve a same technical problem and achieve a same technical effect.

Furthermore, in the embodiments of the present disclosure, there is further provided a gate driving circuit comprising at least one stage of shift register unit which adopts any one of the above shift registers.

Except a first stage of shift register unit and a last stage of shift register unit, for each stage of shift register unit, the input terminal thereof is connected to the output terminal of its previous stage of shift register unit, and the reset terminal thereof is connected to the output terminal of its next stage of shift register unit.

In case that the first external signal is at a high level and the second external signal is at a low level, the gate driving circuit implements a forward scanning.

In case that the first external signal is at a low level and the second external signal is at a high level, the gate driving circuit implements a backward scanning.

It can be seen that the gate driving circuit has technical features corresponding to those of any one of the above shift registers, and thus can solve a same technical problem and achieve a same technical effect.

Finally, in the embodiments of the present disclosure, there is further provided a display device comprising any one of the above gate driving circuits. The display device may be a liquid display screen, an electronic paper, a mobile phone, a tablet computer, a TV, a notebook computer, a digital photo frame, a navigator and any other product or part with a display function. It can be seen that the display device has the technical features corresponding to those of any one of the above gate driving circuits, and thus can solve a same technical problem and achieve a same technical effect.

To sum up, in the present disclosure, by aid of the trigger module or the trigger unit, an external trigger signal and the circuits inside the shift register are insulated from each other when no signal is inputted and are connected when a signal is inputted, such that the elements or the circuit modules inside the shift register flip their states only when a signal is inputted, and thus power consumed by state flipping when no signal is inputted can be saved, which is benefit for reducing of power consumption of the whole circuit and improving of performance of the display device.

It should be noted that, in this description, relationship terms such as first, second, third, fourth and the like are merely used to distinguish one entity or operation from another entity or operation, without necessarily requiring or implying these entities or operations have such actual relationship or sequence thereinbetween. In addition, terms of "comprise" and "include" or any other variations thereof are intended to enclose non-exclusive "comprising", such that a process, a method, a product or a device comprising a series of elements is not only comprising these elements, but also comprising other elements not listed explicitly or comprising inherent elements of the process, the method, the product or the device. In case no further limitation, "a(n) . . . " element comprised and defined in the process, the method, the product or the device does not exclude that additional same element exists in the process, the method, the product or the device.

The above embodiments are merely to describe, not intended to limit, the technical solutions of the present disclosure; although the present disclosure have already been described in detail with reference to the above embodiments, as will be appreciated by those of ordinary skill in the art, it is still possible to modify the technical solutions recorded in the above respective embodiments, or make equivalent alternatives to partial technical features contained therein; and these modifications or alternatives do not make corresponding technical solutions depart from the spirit and scope of the technical solutions in the respective embodiments of the present disclosure.

The present application claims priority of Chinese Patent Application No. CN 201410559992.1 titled as "shift register, driving method, gate driving circuit and display device" filed on Oct. 20, 2014, the disclosure of which is incorporated by reference herein in entirety.

What is claimed is:

1. A shift register comprising an input terminal, a reset terminal, a trigger terminal and an output terminal, further comprising:
   an input module connected to the input terminal and the reset terminal and with an output terminal connected to a first input terminal of an flip-flop output module, and configured to deliver a signal received from the input terminal or a signal received from the reset terminal to the first input terminal of the flip-flop output module under the control of an external signal;
   a trigger module connected to the input terminal, the reset terminal and the trigger terminal with an output terminal connected to a second input terminal of the flip-flop output module, and configured to deliver a signal received from the trigger terminal to the second input terminal of the flip-flop output module when a signal is received from the input terminal or from the reset terminal; and
   the flip-flop output module connected to the input module, the trigger module and the output terminal and configured to flip a signal outputted from the output terminal between an output state and a reset state according to the signal from the input module under the trigger of the signal from the trigger module.

2. The shift register of claim 1, wherein the trigger module comprises a first NOR gate and a second NOR gate,
   a first input terminal of the first NOR gate is connected to the input terminal of the shift register,
   a second input terminal of the first NOR gate is connected to the reset terminal of the shift register,
   an output terminal of the first NOR gate is connected to a first input terminal of the second NOR gate,
   a second input terminal of the second NOR gate is connected to the trigger terminal of the shift register, and
   an output terminal of the second NOR gate is used as the output terminal of the trigger module and is connected to the second input terminal of the flip-flop output module.

3. The shift register of claim 2, wherein the flip-flop output module comprises a first tri-state NOT gate, a second tri-state NOT gate, a first inverter and a second inverter;
   an input terminal of the first inverter, a non-inverting control terminal of the first tri-state NOT gate and an inverting control terminal of the second tri-state NOT gate are connected to the output terminal of the trigger module;
   an output terminal of the first inverter is connected to an inverting control terminal of the first tri-state NOT gate and a non-inverting control terminal of the second tri-state NOT gate;
   an output terminal of the first tri-state NOT gate and an output terminal of the second tri-state NOT gate are connected to an input terminal of the second inverter;
   an output terminal of the second inverter is connected to an input terminal of the second tri-state NOT gate and the output terminal of the shift register;
   an input terminal of the first tri-state NOT gate is connected to the output terminal of the input module.

4. The shift register of claim 3, wherein the input module comprises a first switching element, a second switching element, a third switching element and a fourth switching element;
   the input terminal of the shift register is connected to a first terminal of the third switching element and a second terminal of the first switching element;
   the reset terminal of the shift register is connected to a second terminal of the fourth switching element and a first terminal of the second switching element;
   the first input terminal of the flip-flop output module is connected to a second terminal of the third switching element, a first terminal of the first switching element, a first terminal of the fourth switching element and a second terminal of the second switching element;
   a control terminal of the first switching element and a control terminal of the fourth switching element are connected to a first external signal, and
   a control terminal of the second switching element and a control terminal of the third switching element are connected to a second external signal.

5. The shift register of claim 4, wherein the first switching element and the second switching element are N channel thin film transistors, the third switching element and the fourth switching element are P channel thin film transistors.

6. A driving method for a shift register of claim 4, comprising the trigger module delivering a signal received from the trigger terminal to the flip-flop output module when a signal is received at the input terminal, such that the flip-flop output module flips the signal outputted from the output terminal to the output state according to the signal from the input terminal under the trigger of the signal delivered by the trigger module;
   the trigger module delivering a signal received from the trigger terminal to the flip-flop output module when a signal is received at the reset terminal, such that the flip-flop output module flips the signal outputted from the output terminal to the reset state according to the signal from the input terminal under the trigger of the signal delivered by the trigger module,
   wherein the first external signal is at a high level and the second external signal is at a low level,
   the output terminal of the input module is at a low level when the input terminal is at a low level, and is at a high level when the input terminal is at a high level;
   the output terminal of the trigger module is at a low level when the input terminal and the reset terminal are both at a low level, is at a high level when one of the input terminal and the reset terminal is at a high level and the trigger terminal is at a low level, and is at a low level when one of the input terminal and the reset terminal is at a high level and the trigger terminal is at a high level;

the flip-flop output module forms a latch and the flip-flop output terminal of the output module is at a level same as that at the output terminal of the input module when the output terminal of the trigger module is at a high level; and the flip-flop output module forms a steady state holding circuit and the output terminal of the flip-flop output module is at a level independent of that at the output terminal of the input module when the output terminal of the trigger module is at a low level.

7. A driving method for a shift register of claim 4, comprising the trigger module delivering a signal received from the trigger terminal to the flip-flop output module when a signal is received at the input terminal, such that the flip-flop output module flips the signal outputted from the output terminal to the output state according to the signal from the input terminal under the trigger of the signal delivered by the trigger module;

the trigger module delivering a signal received from the trigger terminal to the flip-flop output module when a signal is received at the reset terminal, such that the flip-flop output module flips the signal outputted from the output terminal to the reset state according to the signal from the input terminal under the trigger of the signal delivered by the trigger module, wherein the first external signal is at a low level and the second external signal is at a high level, the output terminal of the input module is at a low level when the input terminal is at a low level, and is at a high level when the input terminal is at a high level;

the output terminal of the trigger module is at a low level when the input terminal and the reset terminal are both at a low level, is at a high level when one of the input terminal and the reset terminal is at a high level and the trigger terminal is at a low level, and is at a low level when one of the input terminal and the reset terminal is at a high level and the trigger terminal is at a high level;

the flip-flop output module forms a latch and the flip-flop output terminal of the output module is at a level same as that at the output terminal of the input module when the output terminal of the trigger module is at a high level; and the flip-flop output module forms a steady state holding circuit and the output terminal of the flip-flop output module is at a level independent of that at the output terminal of the input module when the output terminal of the trigger module is at a low level.

8. The shift register of claim 1, wherein the trigger module comprises an OR gate and a NAND gate, a first input terminal of the OR gate is connected to the input terminal of the shift register, a second input terminal of the OR gate is connected to the reset terminal of the shift register, an output terminal of the OR gate is connected to a first input terminal of the NAND gate, a second input terminal of the NAND gate is connected to the trigger terminal of the shift register, and an output terminal of the NAND gate is used as the output terminal of the trigger module and is connected to the second input terminal of the flip-flop output module.

9. The shift register of claim 8, wherein the flip-flop output module comprises a first tri-state NOT gate, a second tri-state NOT gate, a first inverter and a second inverter;

an input terminal of the first inverter, an inverting control terminal of the first tri-state NOT gate and a non-inverting control terminal of the second tri-state NOT gate are connected to the output terminal of the trigger module;

an output terminal of the first inverter is connected to a non-inverting control terminal of the first tri-state NOT gate and an inverting control terminal of the second tri-state NOT gate;

an output terminal of the first tri-state NOT gate and an output terminal of the second tri-state NOT gate are connected to an input terminal of the second inverter;

an output terminal of the second inverter is connected to an input terminal of the second tri-state NOT gate and the output terminal of the shift register;

an input terminal of the first tri-state NOT gate is connected to the output terminal of the input module.

10. The shift register of claim 9, wherein the input module comprises a first switching element, a second switching element, a third switching element and a fourth switching element;

the input terminal of the shift register is connected to a first terminal of the third switching element and a second terminal of the first switching element;

the reset terminal of the shift register is connected to a second terminal of the fourth switching element and a first terminal of the second switching element;

the first input terminal of the flip-flop output module is connected to a second terminal of the third switching element, a first terminal of the first switching element, a first terminal of the fourth switching element and a second terminal of the second switching element;

a control terminal of the first switching element and a control terminal of the fourth switching element are connected to a first external signal, and a control terminal of the second switching element and a control terminal of the third switching element are connected to a second external signal.

11. A driving method for a shift register of claim 10, comprising the trigger module delivering a signal received from the trigger terminal to the flip-flop output module when a signal is received at the input terminal, such that the flip-flop output module flips the signal outputted from the output terminal to the output state according to the signal from the input terminal under the trigger of the signal delivered by the trigger module;

the trigger module delivering a signal received from the trigger terminal to the flip-flop output module when a signal is received at the reset terminal, such that the flip-flop output module flips the signal outputted from the output terminal to the reset state according to the signal from the input terminal under the trigger of the signal delivered by the trigger module, wherein the first external signal is at a high level and the second external signal is at a low level, the output terminal of the input module is at a low level when the reset terminal is at a low level, and is at a high level when the reset terminal is at a high level;

the output terminal of the trigger module is at a high level when the input terminal and the reset terminal are both at a low level, is at a low level when one of the input terminal and the reset terminal is at a high level and the trigger terminal is at a high level, and is at a high low level when one of the input terminal and the reset terminal is at a high level and the trigger terminal is at a low level;

the flip-flop output module forms a latch and the flip-flop output terminal of the output module is at a level same as that at the output terminal of the input module when the output terminal of the trigger module is at a low level; and the flip-flop output module forms a steady state holding circuit and the output terminal of the flip-flop output module is at a level independent of that at the output terminal of the input module when the output terminal of the trigger module is at a high level.

12. A driving method for a shift register of claim 10, comprising the trigger module delivering a signal received from the trigger terminal to the flip-flop output module when a signal is received at the input terminal, such that the flip-flop output module flips the signal outputted from the output terminal to the output state according to the signal from the input terminal under the trigger of the signal delivered by the trigger module;

the trigger module delivering a signal received from the trigger terminal to the flip-flop output module when a signal is received at the reset terminal, such that the flip-flop output module flips the signal outputted from the output terminal to the reset state according to the signal from the input terminal under the trigger of the signal delivered by the trigger module, wherein the first external signal is at a low level and the second external signal is at a high level, the output terminal of the input module is at a low level when the reset terminal is at a low level, and is at a high level when the reset terminal is at a high level;

the output terminal of the trigger module is at a high level when the input terminal and the reset terminal are both at a low level, is at a low level when one of the input terminal and the reset terminal is at a high level and the trigger terminal is at a high level, and is at a high level when one of the input terminal and the reset terminal is at a high level and the trigger terminal is at a low level;

the flip-flop output module forms a latch and the flip-flop output terminal of the output module is at a level same as that at the output terminal of the input module when the output terminal of the trigger module is at a low level; and the flip-flop output module forms a steady state holding circuit and the output terminal of the flip-flop output module is at a level independent of that at the output terminal of the input module when the output terminal of the trigger module is at a high level.

13. A driving method for a shift register of claim 1, comprising:

the trigger module delivering a signal received from the trigger terminal to the flip-flop output module when a signal is received at the input terminal, such that the flip-flop output module flips the signal outputted from the output terminal to the output state according to the signal from the input terminal under the trigger of the signal delivered by the trigger module;

the trigger module delivering a signal received from the trigger terminal to the flip-flop output module when a signal is received at the reset terminal, such that the flip-flop output module flips the signal outputted from the output terminal to the reset state according to the signal from the input terminal under the trigger of the signal delivered by the trigger module.

14. A display device comprising a gate driving circuit, wherein the gate driving circuit comprising at least one stage of shift register unit of claim 1, wherein except a first stage of shift register unit and a last stage of shift register unit, for each stage of shift register unit, the input terminal thereof is connected to the output terminal of its previous stage of shift register unit, and the reset terminal thereof is connected to the output terminal of its next stage of shift register unit.

15. The display device of claim 14, wherein the trigger module in each stage of shift register unit comprises a first NOR gate and a second NOR gate, a first input terminal of the first NOR gate is connected to the input terminal of the shift register, a second input terminal of the first NOR gate is connected to the reset terminal of the shift register, an output terminal of the first NOR gate is connected to a first input terminal of the second NOR gate, a second input terminal of the second NOR gate is connected to the trigger terminal of the shift register, and an output terminal of the second NOR gate is used as the output terminal of the trigger module and is connected to the second input terminal of the flip-flop output module.

16. The display device of claim 15, wherein the flip-flop output module in each stage of shift register unit comprises a first tri-state NOT gate, a second tri-state NOT gate, a first inverter and a second inverter;

an input terminal of the first inverter, a non-inverting control terminal of the first tri-state NOT gate and an inverting control terminal of the second tri-state NOT gate are connected to the output terminal of the trigger module;

an output terminal of the first inverter is connected to an inverting control terminal of the first tri-state NOT gate and a non-inverting control terminal of the second tri-state NOT gate;

an output terminal of the first tri-state NOT gate and an output terminal of the second tri-state NOT gate are connected to an input terminal of the second inverter;

an output terminal of the second inverter is connected to an input terminal of the second tri-state NOT gate and the output terminal of the shift register;

an input terminal of the first tri-state NOT gate is connected to the output terminal of the input module.

17. The display device of claim 14, wherein the trigger module in each stage of shift register unit comprises an OR gate and a NAND gate, a first input terminal of the OR gate is connected to the input terminal of the shift register, a second input terminal of the OR gate is connected to the reset terminal of the shift register, an output terminal of the OR gate is connected to a first input terminal of the NAND gate, a second input terminal of the NAND gate is connected to the trigger terminal of the shift register, and an output terminal of the NAND gate is used as the output terminal of the trigger module and is connected to the second input terminal of the flip-flop output module.

18. The shift register of claim 17, wherein the flip-flop output module in each stage of shift register unit comprises a first tri-state NOT gate, a second tri-state NOT gate, a first inverter and a second inverter;

an input terminal of the first inverter, an inverting control terminal of the first tri-state NOT gate and a non-inverting control terminal of the second tri-state NOT gate are connected to the output terminal of the trigger module;

an output terminal of the first inverter is connected to a non-inverting control terminal of the first tri-state NOT gate and an inverting control terminal of the second tri-state NOT gate;

an output terminal of the first tri-state NOT gate and an output terminal of the second tri-state NOT gate are connected to an input terminal of the second inverter;

an output terminal of the second inverter is connected to an input terminal of the second tri-state NOT gate and the output terminal of the shift register;

an input terminal of the first tri-state NOT gate is connected to the output terminal of the input module.

19. The display device of claim 14, wherein the input module in each stage of shift register unit comprises a first switching element, a second switching element, a third switching element and a fourth switching element;
   the input terminal of the shift register unit is connected to a first terminal of the third switching element and a second terminal of the first switching element;
   the reset terminal of the shift register unit is connected to a second terminal of the fourth switching element and a first terminal of the second switching element;
   the first input terminal of the flip-flop output module is connected to a second terminal of the third switching element, a first terminal of the first switching element, a first terminal of the fourth switching element and a second terminal of the second switching element;
   a control terminal of the first switching element and a control terminal of the fourth switching element are connected to a first external signal, and
   a control terminal of the second switching element and a control terminal of the third switching element are connected to a second external signal.

20. The display device of claim 19, wherein
   the first external signal is at a high level and the second external signal is at a low level, the gate driving circuit implements a forward scanning; or
   the first external signal is at a low level and the second external signal is at a high level, the gate driving circuit implements a backward scanning.

* * * * *